US007528544B2

(12) United States Patent
Kwak et al.

(10) Patent No.: US 7,528,544 B2

(45) Date of Patent: May 5, 2009

(54) FLAT PANEL DISPLAY HAVING SPECIFIC CONFIGURATION OF DRIVING POWER SUPPLY LINE

(75) Inventors: Won-Kyu Kwak, Seongnam (KR); Mi-Sook Suh, Yongin (KR); Choon-Yul Oh, Gunpo (KR)

(73) Assignee: Samsung Mobile Display Co., Ltd., Suwon-si (KR)

(*) Notice: Subject to any disclaimer, the term of this patent is extended or adjusted under 35 U.S.C. 154(b) by 410 days.

(21) Appl. No.: 10/831,621

(22) Filed: Apr. 26, 2004

(65) Prior Publication Data

US 2005/0023956 A1 Feb. 3, 2005

(30) Foreign Application Priority Data

Jul. 29, 2003 (KR) ..................... 10-2003-0052459

(51) Int. Cl.
*H05B 33/06* (2006.01)

(52) U.S. Cl. ....................... 313/506; 313/512; 313/504; 257/72; 315/169.3

(58) Field of Classification Search ......... 313/503-512; 315/169.3; 257/72
See application file for complete search history.

(56) References Cited

U.S. PATENT DOCUMENTS

| | | | |
|---|---|---|---|
| 5,882,761 A | 3/1999 | Kawami et al. | |
| 6,359,606 B1 | 3/2002 | Yudasaka | |
| 6,690,110 B1 * | 2/2004 | Yamada et al. .............. | 313/506 |
| 6,965,363 B2 | 11/2005 | Sato et al. | |
| 7,038,377 B2 | 5/2006 | Kobayashi et al. | |
| 2003/0080678 A1 | 5/2003 | Kim et al. | |

(Continued)

FOREIGN PATENT DOCUMENTS

| | | |
|---|---|---|
| JP | 06-160904 | 6/1994 |
| JP | 10-96948 | 4/1998 |
| JP | 2000172779 A | 6/2000 |

(Continued)

OTHER PUBLICATIONS

Office Action issued in Korean Patent Application No. 2003-52459 on Jul. 25, 2005.

Office Action issued on Nov. 28, 2006 by the Japanese Patent Office for Japanese Patent Application No. 2003-374205.

*Primary Examiner*—Karabi Guharay
(74) *Attorney, Agent, or Firm*—Stein, McEwen & Bui, LLP

(57) ABSTRACT

A flat panel display device includes a display region formed on a substrate, the display region having a gate electrode, a source electrode, a drain electrode, and a self-emission device with two electrodes, and displaying a predetermined image; a covering member to cover at least the display region; a sealing member comprising a sealing material coated outside and around at least the display region, by which edges of the covering member are bonded to the substrate to seal at least the display region; a terminal region installed on the substrate outside the sealing member; and a driving power supply line to supply a driving potential power and/or a source current to the display region, the driving power supply line comprising at least two conductive layers and being arranged in such a way that at least a part of the driving power supply line is positioned between the sealing member and the substrate. Therefore, the ratio of the display region to the total size of the display increases and a non-emission region decreases. In addition, the resistance of the power supply lines is reduced.

60 Claims, 10 Drawing Sheets

U.S. PATENT DOCUMENTS

2003/0089991 A1 5/2003 Yamazaki et al.
2003/0122495 A1 7/2003 Nakanishi
2003/0127651 A1* 7/2003 Murakami et al. ............ 257/72
2003/0168966 A1 9/2003 Kobayashi et al.

FOREIGN PATENT DOCUMENTS

JP 2000173766 A 6/2000
JP 2000173779 A 6/2000
JP 2001-119395 4/2001
JP 2002-110343 4/2002
JP 2002-287663 10/2002
JP 2003-187967 7/2003
KR 2002-0009498 2/2002
KR 2003-47800 6/2003
KR 2003-51326 6/2003
WO WO 03/060858 7/2003

* cited by examiner

FLAT PANEL DISPLAY HAVING SPECIFIC CONFIGURATION OF DRIVING POWER SUPPLY LINE

CROSS-REFERENCE TO RELATED APPLICATIONS

This application claims the priority of Korean Patent Application No. 2003-52459, filed on Jul. 29, 2003, in the Korean Intellectual Property Office, the disclosure of which is incorporated herein in its entirety by reference.

BACKGROUND OF THE INVENTION

1. Field of the Invention

The present invention relates to a flat panel display, and more particularly, to a flat panel display with a larger display region and a reduced line resistance.

2. Description of the Related Art

Flat panel displays such as liquid crystal displays, organic electroluminescent displays, and inorganic electroluminescent displays are divided into a passive matrix (PM)-type and an active matrix (AM)-type according to their driving methods. PM flat panel displays have a simple intersection structure of column electrodes (anodes) and row electrodes (cathodes). Scanning signals output from a row driving circuit are supplied to cathodes. At this time, only one row is selected from multiple rows. Then, a column driving circuit outputs data signals, which are then inputted into each pixel. On the other hand, AM flat panel displays control a signal to be sent to each pixel using a thin film transistor (TFT). Due to high signal processing performance, the AM flat panel displays have been widely used as displays for moving images.

Among flat panel displays, organic electroluminescent displays comprise a light emission layer comprising an organic material, which is interposed between an anode and a cathode. When positive and negative voltages are respectively applied to these electrodes, holes from the anode migrate toward the light emission layer via a hole transport layer and electrons from the cathode are injected into the light emission layer via an electron transport layer. At this time, the electrons and the holes recombine with each other at the light emission layer to generate an exciton. When the exciton is changed from an excited state to a ground state, a fluorescent molecule of the light emission layer emits light, which displays an image. When the organic electroluminescent displays are provided with pixels emitting red (R), green (R), and blue (B) light, full color organic electroluminescent displays that display full color may be realized.

However, such organic electroluminescent displays have a limitation in that organic films such as a light emission layer are very susceptible to moisture. In this regard, attempts have been made to prevent the entry of external moisture into a light emission layer and protect the display regions of the organic electroluminescent displays from external physical impacts. As an example thereof, a sealing process is known for a display region, wherein the process uses a substrate or a metal cap.

FIGS. 1 and 2 show a conventional active matrix organic electroluminescent display.

Referring to FIGS. 1 and 2, an active matrix organic electroluminescent display has a predetermined display region 2 comprising organic electroluminescent devices. The display region 2 is formed on a transparent insulating substrate 11 and is sealed by bonding a covering member 12, such as a metal cap, to the substrate 11 by utilizing a sealing member 13 made of a sealing material. In the display region 2, organic electroluminescent devices, together with thin film transistors, are arranged to form multiple pixels. The top portion of the display region 2 is formed with a cathode 243, one electrode of the organic electroluminescent devices. The cathode 243 is connected to an external terminal region 3 through an electrode power line 42 installed at one side of the display region 2. Multiple VDD lines 25 are also arranged in the display region 2. The VDD lines 25 are connected to the terminal region 3 through a driving power line 41 installed outside the display region 2 to supply a driving potential power and/or a source current to the display region 2. In addition, a vertical circuit 51 and a horizontal circuit 52 are installed outside the display region 2 to send a signal to thin film transistors of the display region 2. The vertical and horizontal circuits 51 and 52 are connected to the terminal region 3 through circuit lines 43 and 44, respectively.

All regions of the above-described active matrix organic electroluminescent display, including the display region 2, the power lines 41 and 42, and vertical and horizontal circuits 51 and 52, except for the terminal region 3, are covered with the covering member 12 such as a metal cap and then sealed. Therefore, together with the display region 2 displaying an image, regions that take no part in an image display, i.e., the power lines 41 and 42 and vertical and horizontal circuits 51 and 52 are also present inside the covering member 12. This leads to a decrease in the ratio of the display region 2 intended for light emission to the total size of an organic electroluminescent display. Therefore, a dead space, which is a non-emission region, increases, thus lowering a light emission efficiency.

In addition, for the foregoing reason, in the organic electroluminescent display shown in FIGS. 1 and 2, the power lines 41 and 42, which connect the display region 2 to the terminal region 3, must have a very small width. Due to such a very small width, the organic electroluminescent display undergoes an increase of resistance in the power lines.

These are common limitations for active matrix organic electroluminescent displays. The organic electroluminescent displays disclosed in Japanese Patent Laid-Open Publication Nos. 2000-173779 and 2000-173766 also have the above-described limitations.

Meanwhile, U.S. Pat. No. 6,359,606 discloses an active matrix organic electroluminescent display, the entire surface of which is covered with a protective film, instead of using a covering member, such as a metal cap and a glass substrate. The protective film prevents the entry of moisture or oxygen, and thus inhibits deterioration of organic electroluminescent devices.

However, since the above active matrix type display protects inner devices thereof using a thin protective film, the inner devices of the display cannot be protected sufficiently from external impact. Also, since organic electroluminescent displays require complete prevention against exposure to moisture, such an aspect cannot be accomplished only using the protective film. This fact is supported by U.S. Pat. No. 5,882,761, in which an organic electroluminescent display further comprises a moisture absorbent inside a metal cap or a glass substrate. In addition, displays only using such a thin protective film cannot be used as front-surface emission types and both-surface emission types that project an image toward a sealing member.

Korean Patent Laid-Open Publication No. 2002-9498 discloses an electroluminescent display sealed with a covering member and a sealing member. The display comprises multiple lines interconnected in parallel, which are arranged between the sealing member and a substrate. However, since the multiple lines have a small width and are interconnected in parallel, there are problems in that a line structure is complicated, and a line resistance increases.

SUMMARY OF THE INVENTION

An aspect of the present invention includes a flat panel display with an increased ratio of a display region to the total size of the display as a result of a reduction of a non-emission region.

An aspect of the present invention also includes a flat panel display with a reduced line resistance of power supply lines, such as a driving power supply line, and an electrode power supply line.

An aspect of the present invention also includes a flat panel display with power supply lines having a larger width.

According to an aspect of the present invention, a flat panel display comprises: a display region formed on a substrate, the display region having a gate electrode, a source electrode, a drain electrode, and a self-emission device with two electrodes, and displaying a predetermined image; a covering member to cover at least the display region; a sealing member comprising a sealing material coated outside and around at least the display region, by which edges of the covering member are bonded to the substrate to seal at least the display region; a terminal region installed on the substrate outside the sealing member; and a driving power supply line for to supply a driving potential power and/or a source current to the display region, the driving power supply line comprising at least two conductive layers and being arranged in such a way that at least a part of the driving power supply line is positioned between the sealing member and the substrate.

An insulating film may be interposed between the conductive layers, and the conductive layers may communicate with each other. In this case, the conductive layers may communicate with each other through at least a contact hole formed in the insulating film. One of the conductive layers may comprise the same material as the gate electrode of the display region, the same material as at least one of the source electrode and the drain electrode of the display region, or the same material as one of the two electrodes of the self-emission device of the display region.

The driving power supply line may be connected to a driving power terminal positioned at the terminal region and may be arranged along the sealing member.

The flat panel display may further comprise at least one circuit to control the self-emission device of the display region, and at least a part of the at least one circuit may be arranged between the sealing member and the substrate.

The flat panel display may further comprise an electrode power supply line for to supply an electric power to one of the two electrodes of the self-emission device of the display region, and at least a part of the electrode power supply line may be arranged between the sealing member and the substrate.

The electrode power supply line may comprise at least two conductive layers. An insulating film may be interposed between the conductive layers, and the conductive layers may communicate with each other. In this case, the conductive layers may communicate with each other through at least a contact hole formed in the insulating film. One of the conductive layers may comprise the same material as the gate electrode of the display region, the same material as at least one of the source electrode and the drain electrode of the display region, or the same material as the other electrode of the self-emission device of the display region.

The electrode of the self-emission device connected to the electrode power supply line may be extended to cover at least a part of the electrode power supply line arranged between the sealing member and the substrate.

An insulating film may be interposed between the electrode of the self-emission device connected to the electrode power supply line and the electrode power supply line arranged between the sealing member and the substrate, and the electrode and the electrode power supply line may communicate with each other through at least a contact hole formed in the insulating film.

According to another aspect of the present invention, a flat panel display comprises a display region formed on a substrate, the display region having a gate electrode, a source electrode, a drain electrode, and a self-emission device with two electrodes, and displaying a predetermined image; a covering member to cover at least the display region; a sealing member comprising a sealing material coated outside and around at least the display region, by which edges of the covering member are bonded to the substrate to seal at least the display region; a terminal region installed on the substrate outside the sealing member; and an electrode power supply line to supply an electric power to at least one of the two electrodes of the self-emission device of the display region, the electrode power supply line comprising at least two conductive layers and being arranged in such a way that at least a part of the electrode power supply line is positioned between the sealing member and the substrate.

An insulating film may be interposed between the conductive layers, and the conductive layers may communicate with each other. In this case, the conductive layers may communicate with each other through at least a contact hole formed in the insulating film. One of the conductive layers may comprise the same material as the gate electrode of the display region, the same material as at least one of the source electrode and the drain electrode of the display region, or the same material as the other electrode of the self-emission device of the display region.

The electrode power supply line may be connected to an electrode power terminal positioned at the terminal region and may be arranged along the sealing member.

The electrode of the self-emission device connected to the electrode power supply line may be extended to cover at least a part of the electrode power supply line arranged between the sealing member and the substrate.

An insulating film may be interposed between the electrode of the self-emission device connected to the electrode power supply line and the electrode power supply line arranged between the sealing member and the substrate, and the electrode and the electrode power supply line may communicate with each other through at least a contact hole formed in the insulating film.

The flat panel display may further comprise at least one circuit to control the self-emission device of the display region, and at least a part of the at least one circuit may be arranged between the sealing member and the substrate.

According to an embodiment of the present invention, the self-emission device may be an organic electroluminescent device.

According to an embodiment of the present invention, the covering member may be a metal cap or an insulating substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
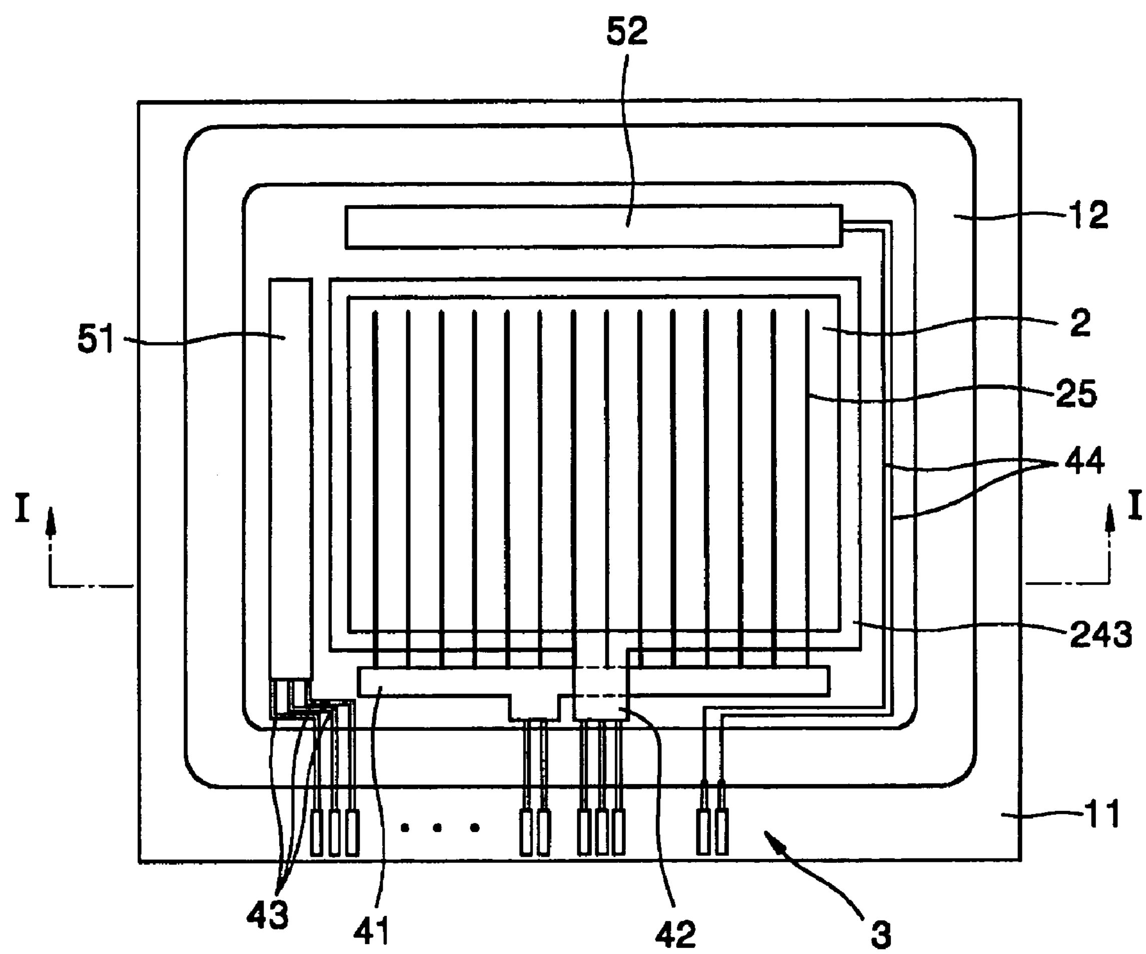
FIG. 1 is a schematic plan view of a conventional active matrix organic electroluminescent display.
Figure 2:
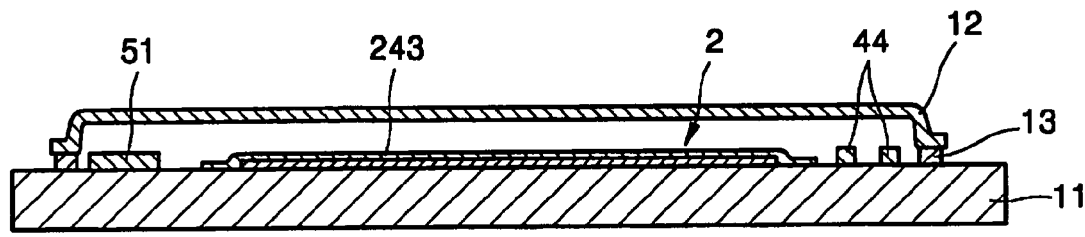
FIG. 2 is a sectional view taken along line I-I in FIG. 1.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 3:
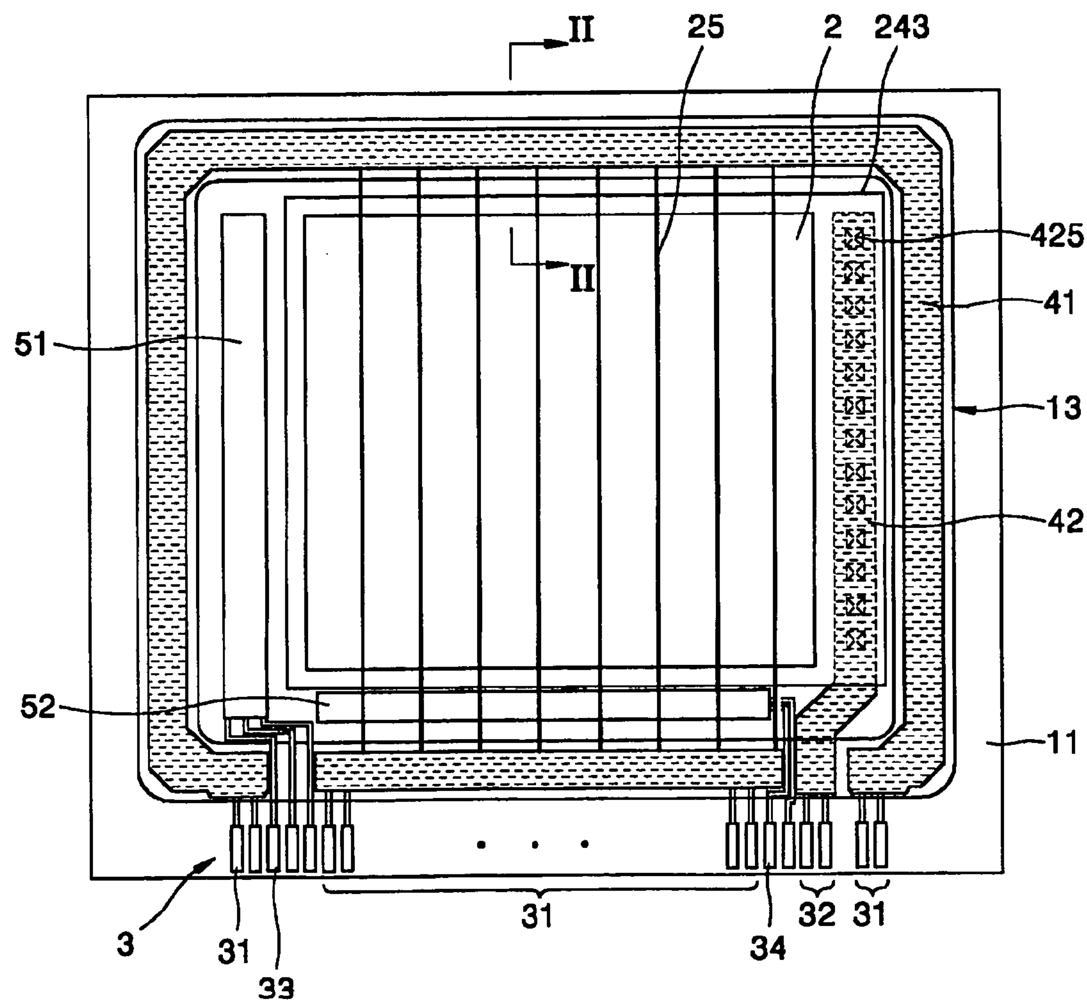
FIG. 3 is a plan view of an active matrix organic electroluminescent display according to an embodiment of the present invention.
Figure 4:
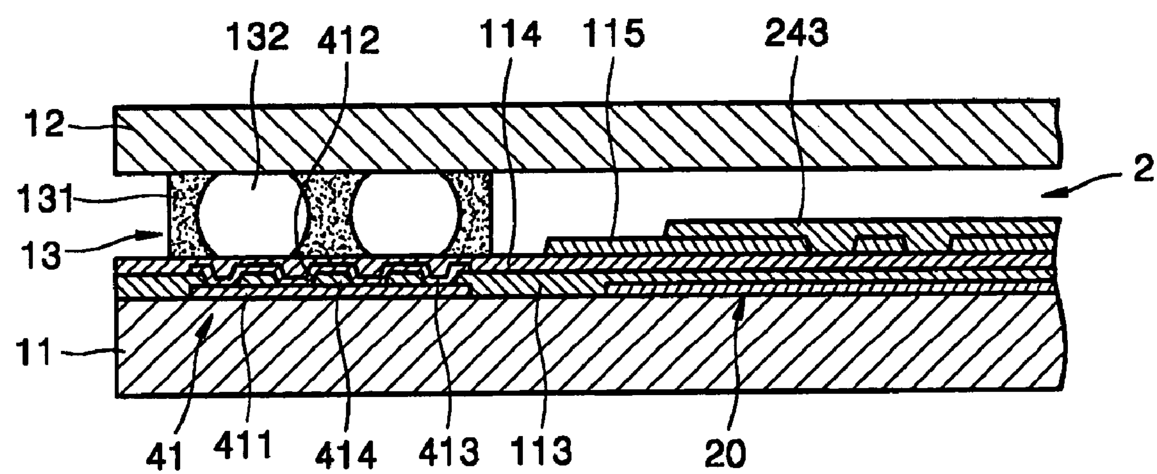
FIG. 4 is a sectional view taken along line II-II in FIG. 3.

FIG. 3 is a plan view of an active matrix organic electroluminescent display according to an embodiment of the present invention, and FIG. 4 is a sectional view taken along line II-II in FIG. 3. FIGS. 5 through 8 are views showing a specific sub-pixel of an active matrix organic electroluminescent display shown in FIG. 3.

An active matrix organic electroluminescent display according to the embodiment of the present invention shown in FIGS. 3 and 4 comprises a plurality of sub-pixels shown in FIGS. 5 through 8. First, these sub-pixels will be described. It is understood that the structure of the sub-pixel shown in FIGS. 5 through 8 is an example of sub-pixel structures that may be applied to active matrix organic electroluminescent displays of embodiments of the present invention.

Figure 5:
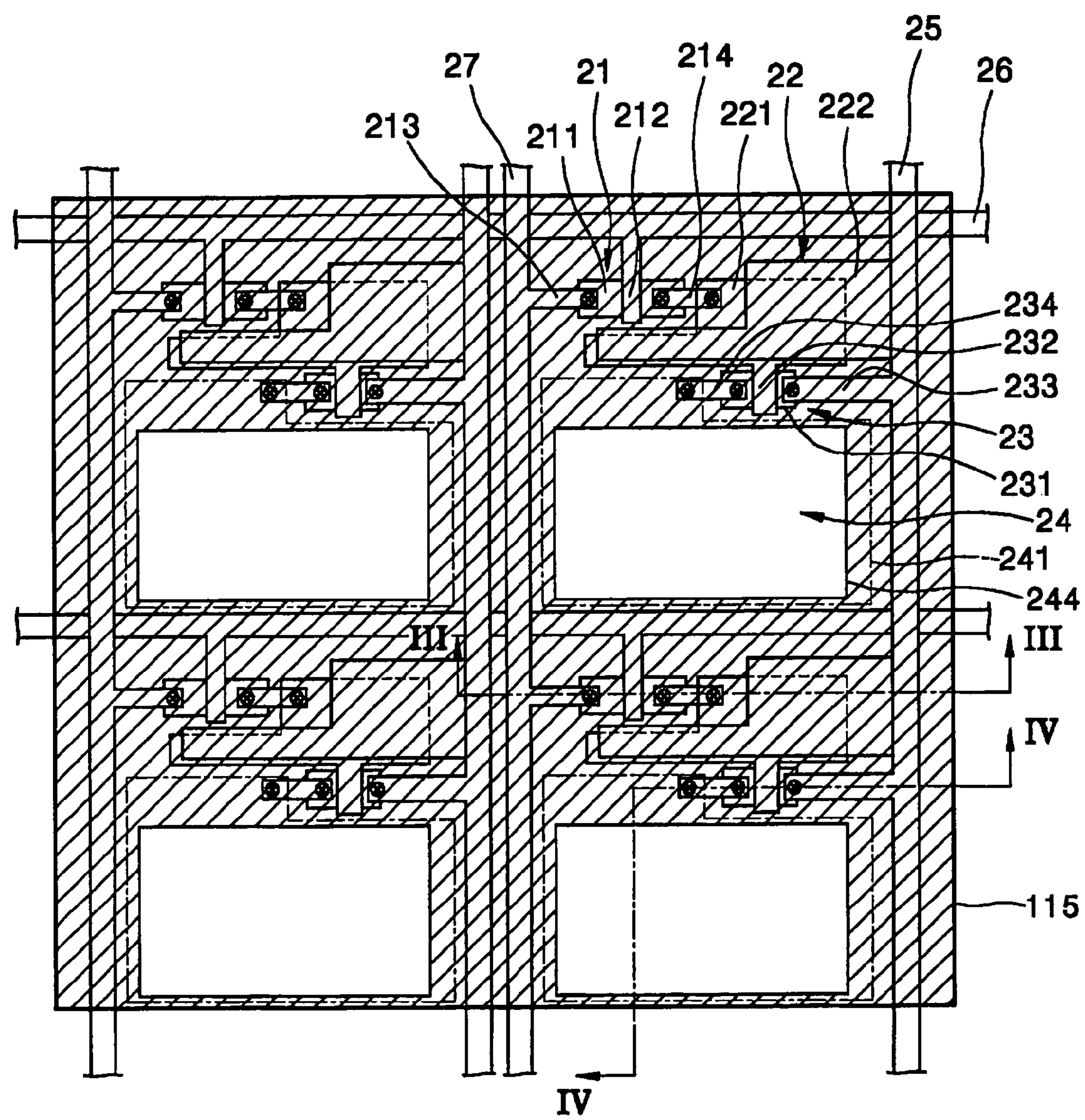
FIG. 5 is an enlarged plan view of partial sub-pixels in FIG. 3.
Figure 6:
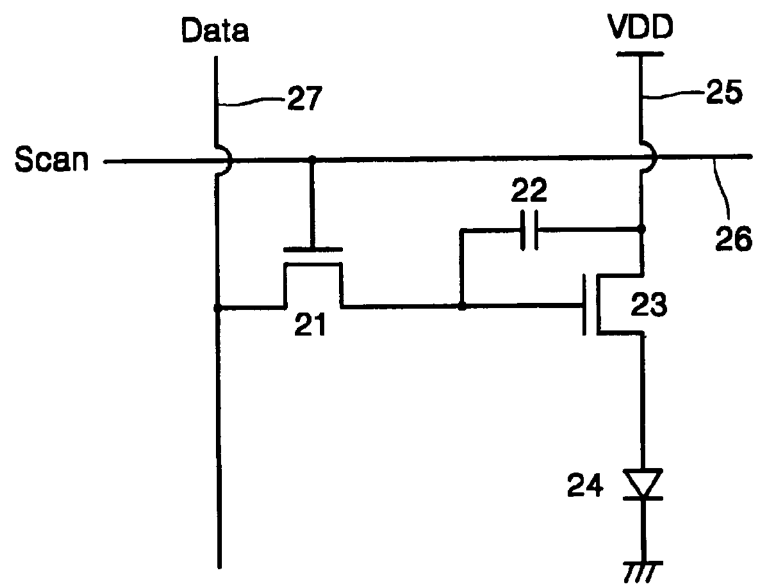
FIG. 6 illustrates the equivalent circuit of a unit pixel in FIG. 3.

FIG. 5 is an enlarged plan view of four sub-pixels adjacent to each other among sub-pixels of an active matrix organic electroluminescent display shown in FIG. 3. FIG. 6 illustrates the equivalent circuit for one of the sub-pixels shown in FIG. 5.

First, referring to FIG. 6, each sub-pixel of the active matrix organic electroluminescent display according to an embodiment of the present invention comprises two thin film transistors (TFTs) comprised of a first TFT 21 to switch and a second TFT 23 to drive, one capacitor 22, and one organic electroluminescent device (hereinafter, simply referred to as "EL device") 24. Since there is no limitation on the number of TFTs and capacitors, more TFTs and capacitors may be used.

The first TFT 21 is driven by a scan signal applied to a gate line 26, and then transmits a data signal applied to a data line 27 to the capacitor 22 and the second TFT 23. The second TFT 23 determines the amount of current to be injected into the EL device 24 according to the data signal transmitted by the first TFT 21, i.e., a voltage difference (Vgs) between a gate and a source. The capacitor 22 stores the data signal transmitted by the first TFT 21 during one frame.

Figure 7:
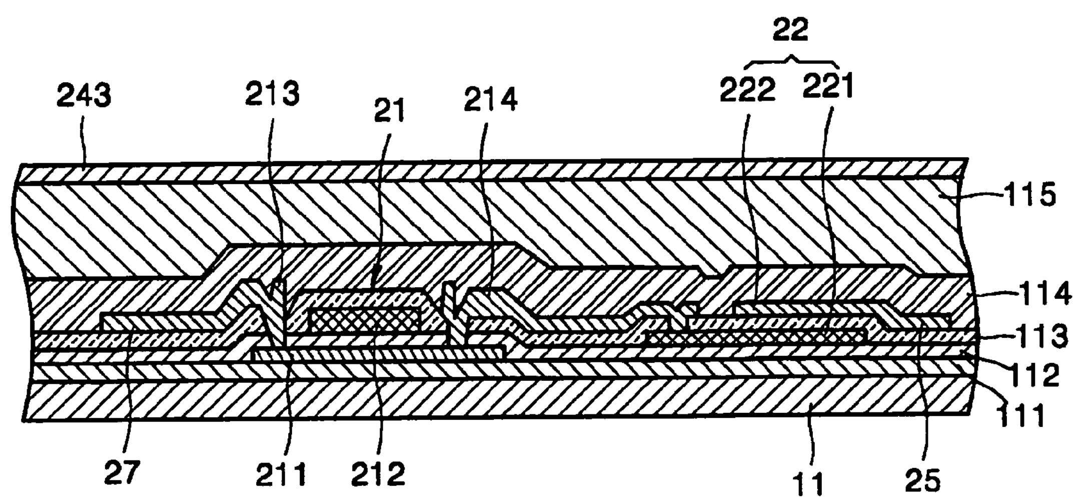
FIG. 7 is a sectional view taken along line III- III in FIG. 5.
Figure 8:
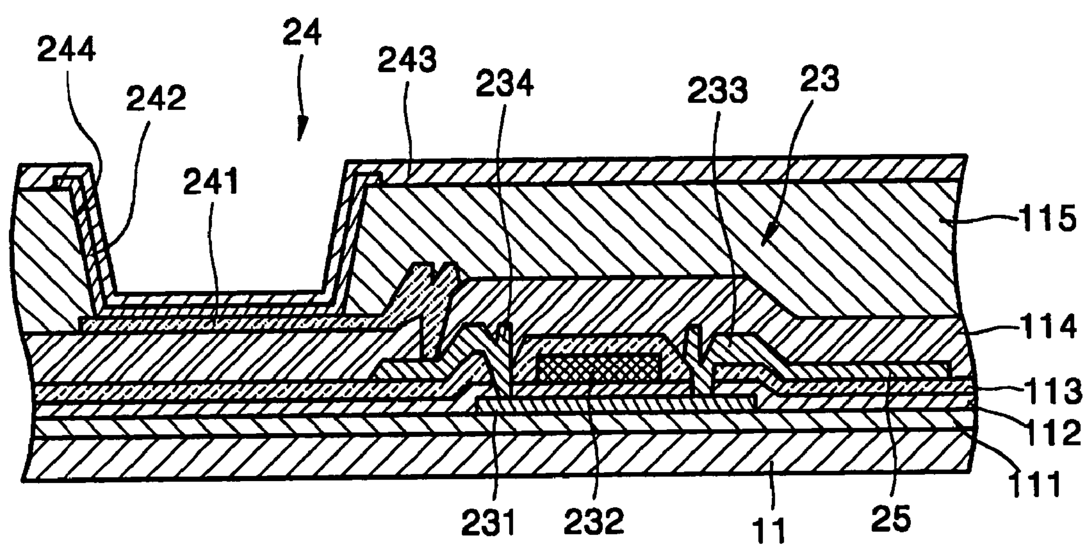
FIG. 8 is a sectional view taken along line IV-IV in FIG. 5.

Such a circuit may be realized in an organic electroluminescent display having the sub-pixel structure shown in FIGS. 5, 7, and 8. The sub-pixel structure will now be described in more detail.

As shown in FIGS. 5, 7, and 8, a buffer layer 111 made of $SiO_2$ is formed on an insulating substrate 11 comprising a glass material. On the buffer 111, the first TFT 21, the second TFT 23, the capacitor 22, and the EL device 24 are formed.

As shown in FIGS. 5 and 7, the first TFT 21 comprises a first active layer 211 formed on the buffer layer 111, a gate insulator 112 formed on the first active layer 211, and a gate electrode 212 formed on the gate insulator 112.

The first active layer 211 may be formed in the form of an amorphous silicon thin film or a polycrystalline silicon thin film. The first active layer 211 has source and drain regions doped with n- or p-type impurity in high concentration.

On the first active layer 211, the gate insulator 112 comprising $SiO_2$ is formed. On a predetermined region of the gate insulator 112, the gate electrode 212 is formed in the form of a conductive film made of MoW or Al/Cu. The gate electrode 212 is connected to the gate line 26 that outputs a TFT on/off signal.

On the gate electrode 212, an inter-insulator 113 is formed. A source electrode 213 and a drain electrode 214 are respectively in contact with the source and drain regions of the first active layer 211 through contact holes formed in the inter-insulator 113 and the gate insulator 112. The source electrode 213 is connected to the data line 27 of FIG. 6 to supply a data signal to the first active layer 211. The drain electrode 214 is connected to a first electrode 221 of the capacitor 22 to supply an electric power to the capacitor 22.

On the source and drain electrodes 213 and 214, a passivation film 114 comprising $SiO_2$ is formed. On the passivation film 114, a planarization film 115 made of acrylic or polyimide is formed.

The capacitor 22 to charge is positioned between the first TFT 21 and the second TFT 23. As shown in FIGS. 5 and 7, the capacitor 22 comprises the first electrode 221 connected to the drain electrode 214 of the first TFT 21; a second electrode 222, which is formed on the first electrode 221 to be overlapped with the first electrode 221 and is electrically connected to a VDD line 25 for power application; and the inter-insulator 113 as a dielectric layer, which is formed between the first and second electrodes 221 and 222. The structure of the capacitor 22 is not limited to the aforementioned structure. A silicon thin film for the TFTs and a conductive layer for the gate electrode may be used as the first and second electrodes for the capacitor, and the gate insulator may be used as the dielectric layer. In addition, the capacitor 22 may be formed by various methods.

As shown in FIGS. 5 and 8, the second TFT 23 comprises a second active layer 231 comprising amorphous silicon thin film or polycrystalline silicon thin film, which is formed on the buffer layer 111. The second active layer 231 has source and drain regions doped with n- or p-type impurity in high concentration. The gate insulator 112 is formed on the second active layer 231 and is connected to the first electrode 221 of the capacitor 22. A gate electrode 232 outputting a TFT on/off signal is formed on the gate insulator 112. A source electrode 233 and a drain electrode 234 are formed on the gate electrode 232. The source electrode 233 is connected to the VDD line 25 to supply a reference voltage to drive the second active layer 231. The drain electrode 234 connects the second TFT 23 and the EL device 24 to each other to supply a driving potential power and/or a source current to the EL device 24. The inter-insulator 113 is interposed between the gate electrode 232 and the source/drain electrodes 233 and 234. The passivation film 114 is interposed between the source/drain electrodes 233 and 234 and an anode 241 that is one electrode of the EL device 24.

The planarization film 115 is formed on the anode 241. After a predetermined opening 244 is formed in the planarization film 115, the EL device 24 is formed.

The EL device 24 displays predetermined image information by emitting red, green, or blue light according to the amount of current. The EL device 24 comprises the anode 241, which is connected to the drain electrode 234 of the second TFT 23 to receive a positive power therefrom; a cathode 243, which covers entire pixels and receives a negative power; and an organic light emission film 242, which is interposed between the anode 241 and the cathode 243.

The anode 241 may be a transparent electrode made of indium tin oxide (ITO). The cathode 243 may be formed by all-area deposition of Al/Ca in a rear emission type that emits light toward the substrate 11. On the other hand, in a front emission type that emits light toward the covering member 12 as shown in FIG. 4, the cathode 243 may be formed by forming a semi-transmissible thin film made of metals such as Mg—Ag, followed by deposition of transparent ITO thereon. All-area deposition is not requisite for the formation of the cathode 243. The cathode 243 may be formed in various patterns. The positions of the anode 241 and the cathode 243 may be changed.

The organic light emission film 242 may be a low molecular or high molecular organic film. The low molecular organic film may have a simple- or multi-laminated structure of a hole injection layer (HIL), a hole transport layer (HTL), an organic emission layer (EML), an electron transport layer (ETL), and an electron injection layer (EIL). An organic material to be used for the low molecular organic film may be copper phthalocyanine (CuPc), N,N-di(naphthalene-1-yl)-N,N'-diphenyl benzidine (NPB), or tris-8-hydroxyquinoline aluminum ($Alq_3$). The low molecular organic film may be formed by vapor deposition.

The high molecular organic film may have a structure comprised of a hole transport layer (HTL) and an organic emission layer (EML). In this case, the hole transport layer may be made of poly(ethylenedioxy)thiophene (PEDOT) and the organic emission layer may be made of a high molecular weight organic material such as poly(phenylene vinylene) (PPV) and polyfluorene. The hole transport layer and the organic emission layer may be formed by screen printing or ink-jet printing.

The structure of an organic electroluminescent device of the present invention is not limited to that as described above. It is understood that an organic electroluminescent device of an embodiment of the present invention may have any structure provided that the aspects of the present invention may be accomplished.

A whole structure of an organic electroluminescent display according to an embodiment of the present invention will now be described with reference again to FIGS. 3 and 4.

The above-described organic electroluminescent devices constitute pixels, which in turn constitute the display region 2 shown in FIG. 3. The display region 2 displays an image. The display region 2 has a circuit region 20 comprised of the thin film transistors and the capacitors as shown in FIGS. 7 and 8.

The substrate 11, on which the display region 2 is formed, is bonded to the covering member 12 through the sealing member 13 to protect the display region 2 from external impact, moisture, or air, as shown in FIG. 4. The covering member 12 may be an insulating substrate made of a glass material or a metal cap made of a metal material.

The terminal region 3 having predetermined terminals is positioned on the substrate 11 at one side of the display region 2. The terminal region 3 is exposed outside the covering member 12.

Meanwhile, a driving power supply line 41 to supply a driving potential power and/or a source current to the VDD line 25 of the display region 2, an electrode power supply line 42 connected to the cathode 243 to supply a cathode power to the cathode 243, and vertical and horizontal circuits 51 and 52 to control a signal to be applied to the display region 2 are arranged around the display region 2.

The driving power supply line 41 is arranged on the substrate 11 to surround the display region 2 and be connected to a driving power terminal 31 of the terminal region 3. The driving power supply line 41 is also arranged below the display region 2 to be connected to the VDD line 25 traversing the display region 2.

The electrode power supply line 42 is arranged at one side of the display region 2 to be electrically connected to the cathode 243 of the display region 2. The electrode power supply line 42 electrically connected to the cathode 243 is connected to the electrode power terminal 32. The cathode 243 may be extended to cover the electrode power supply line 42. An insulating film may be interposed between the cathode 243 and the electrode power supply line 42. In this case, the cathode 243 and the electrode power supply line 42 communicate with each other through contact holes 425 formed in the insulating film. A detailed description thereof will be described later.

The vertical circuit 51 and the horizontal circuit 52 are installed between the driving power supply line 41 and the display region 2. The vertical circuit 51 serves as a scan driving circuit to apply a scan signal to the gate line 26 of the display region 2 and is electrically connected to a scan terminal 33 of the terminal region 3. The horizontal circuit 52 serves as a data driving circuit to apply a data signal to the data line 27 of the display region 2 and is electrically connected to a data terminal 34 of the terminal region 3. The horizontal circuit 52, i.e., the data driving circuit may be positioned on the covering member 12 made of glass, or an external IC or COG may be used as the horizontal circuit 52.

Meanwhile, according to another aspect of the present invention, at least a part of the driving power supply line 41 may be installed between the substrate 11 and the sealing member 13. Thus, the driving power supply line 41 may be arranged below the sealing member 13 along the sealing member 13, as shown in FIGS. 3 and 4. Therefore, the display region 2 may be expanded as much as the area of the driving power supply line 41.

In addition, the driving power supply line 41 may be formed as wide as the width of the sealing member 13 coated with a sealing material 131, as shown in FIG. 4. Due to such a sufficiently large driving power supply line 41, the resistance of the driving power supply line 41 may be reduced, thus preventing a voltage drop.

Meanwhile, the driving power supply line 41 may comprise at least two conductive films to reduce a line resistance. That is, the driving power supply line 41 may comprise a first conductive film 411 formed on the substrate 11, a second conductive film 413, and an insulating film 414 interposed between the first and second conductive films 411 and 413, as shown in FIG. 4.

The first conductive film 411 may be formed simultaneously with the gate electrode of the display region 2 using the same material as the gate electrode. The second conductive film 413 may be formed simultaneously with the source/drain electrode using the same material as the source/drain electrode. The first conductive film 411 may be formed simultaneously with the active layer using the same material as the active layer and the second conductive film 413 may be formed simultaneously with the gate electrode or the source/drain electrode. The first conductive film 411 may comprise the same material as the gate electrode or the source/drain electrode and the second conductive film 413 may comprise the same material as the anode. The first conductive film 411 may comprise the same material as the gate electrode, the source/drain electrode, or the anode, and the second conductive film 413 may comprise the same material as the cathode. It is understood that the first and second conductive films 411 and 413 may be formed by various other methods. That is, the first and second conductive films 411 and 413 may be formed into a two-layered structure by various combinations of the gate electrode, the source/drain electrode, the anode, and the cathode. The active layer of the display region may be partially formed below the first conductive film 411 to be used as a dummy pattern to enhance the junction between the first conductive film 411 and the substrate 11.

The insulating film 414 may be the inter-insulator 113 of the display region 2. Alternatively, the gate insulator or the passivation film may be used as the insulating film 414. The first and second conductive films 411 and 413 communicate with each other through contact holes 412 formed in the insulating film 414.

The resistance of the driving power supply line 41 may be greatly reduced by the two-layered conductive film structure as described above. In addition to the two-layered conductive film structure, the driving power supply line 41 may be formed with a multi-layered conductive film structure. For example, a first conductive film comprising the same material as the gate electrode, a second conductive film comprising the same material as the source/drain electrode, and a third conductive film comprising the same material as the anode or the cathode may be sequentially formed to communicate with each other through contact holes. Alternatively, on the above-described first and second conductive films, a third conductive film as the anode and a fourth conductive film comprising the same material as the cathode may be sequentially formed as the anode and the cathode, respectively. These conductive film structures may be equally applied to those of the power supply lines according to other embodiments of the present invention that will be described below.

It is understood that although not shown in the drawings, the driving power supply line 41 may be formed with a mono-layered structure. That is, the driving power supply line 41 may be formed simultaneously with the source/drain electrode using the same material as the source/drain electrode or simultaneously with one of other conductive layers.

The passivation film 114 is formed on the second conductive film 413. After a spacer 132 is placed on the passivation film 114, the sealing material 131 is coated on the passivation film 114. A front substrate, i.e., the covering member 12 is bonded to a rear substrate, i.e., the insulating substrate 11 by means of the sealing material 131.

Figure 9:
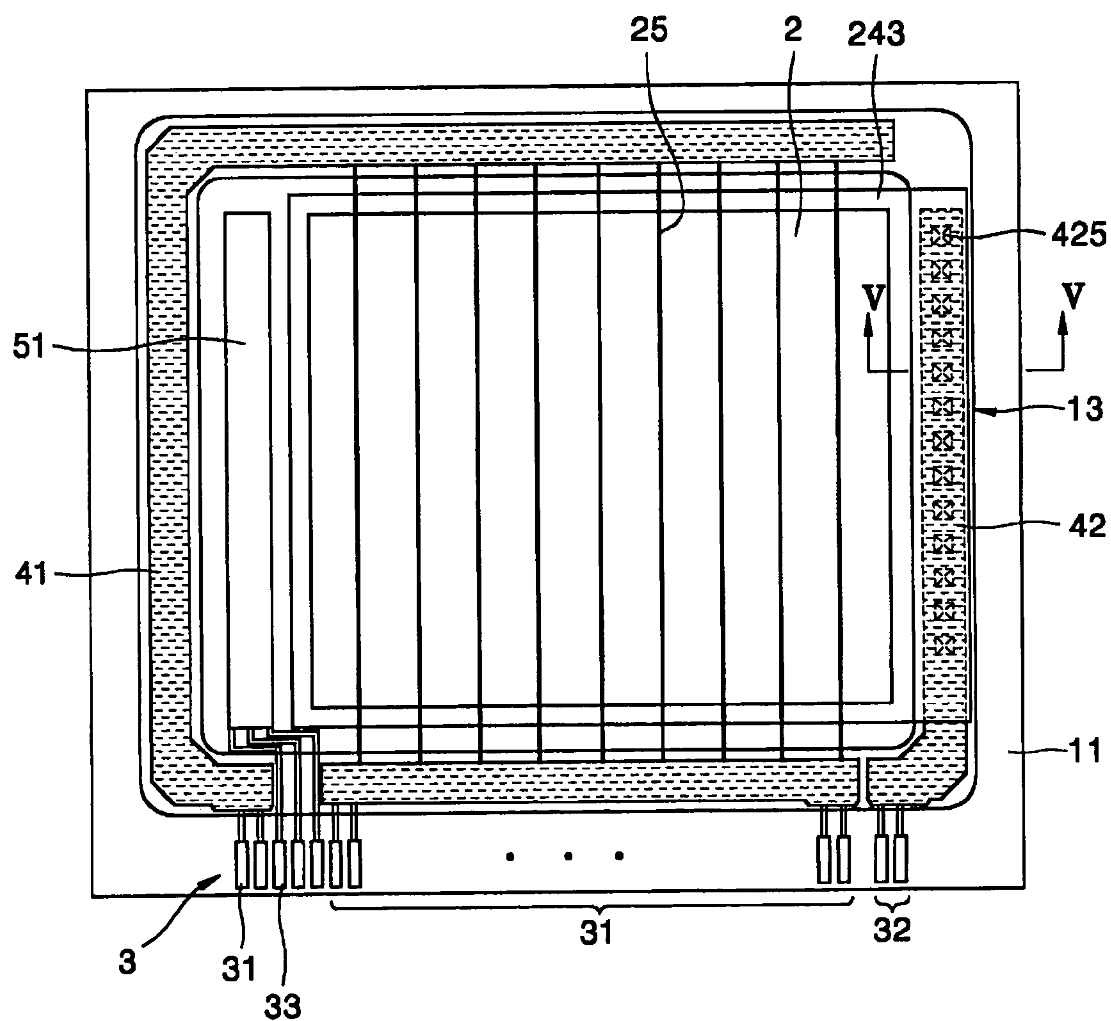
FIG. 9 is a plan view of an active matrix organic electroluminescent display according to another embodiment of the present invention.
Figure 10:
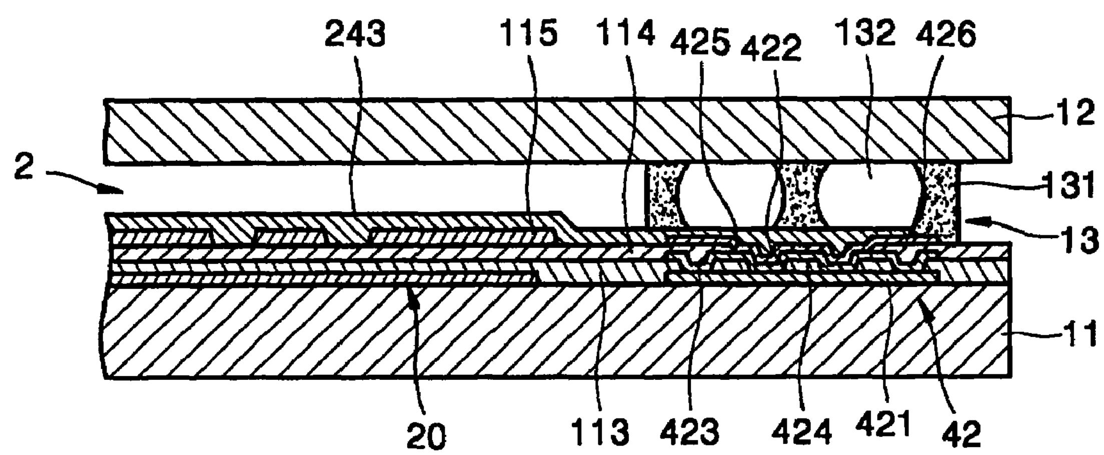
FIG. 10 is a sectional view taken along line V-V in FIG. 9.

FIGS. 9 and 10 are respectively plan and sectional views of an active matrix organic electroluminescent display according to another embodiment of the present invention. A fundamental structure (for example, pixels) of an active matrix organic electroluminescent display of this embodiment of the present invention is substantially the same as presented in the prior embodiment of the present invention shown in FIGS. 3 and 4, and thus, only an arrangement of power supply lines will be described below.

In an active matrix organic electroluminescent display of the second embodiment of the present invention as shown in FIG. 9, the driving power supply line 41 and the electrode power supply line 42 are formed between the substrate 11 and the sealing member 13 along the sealing member 13. The driving power supply line 41 is arranged along the sealing member 13 and connected to the driving power terminal 31. The electrode power supply line 42 is positioned at one side of the sealing member 13 and is connected to the cathode 243. The vertical circuit 51 is arranged on the substrate 11 between the display region 2 and the sealing member 13. According to the embodiment of the present invention as shown in FIG. 9, a horizontal circuit is installed on the covering member 12, instead of being installed on the substrate 11, or an external IC or COG is used as the horizontal circuit. Since there is no limitation on the installation of the horizontal circuit, the horizontal circuit may also be arranged on the substrate 11 below the sealing member 13.

The electrode power supply line 42 may comprise a first conductive film 421, a second conductive film 423, and an insulating film 424, as shown in FIG. 10. The first and second conductive films 421 and 423, and the insulating film 424 may be formed in the same manner as in the prior embodiment of the present invention. That is, the first conductive film 421 may comprise the same material as the gate electrode and the second conductive film 423 may comprise the same material as the source/drain electrode. The first conductive film 421 may comprise the same material as the active layer and the second conductive film 423 may be formed simultaneously with the gate electrode or the source/drain electrode. The first conductive film 421 may comprise the same material as the gate electrode or the source/drain electrode and the second conductive film 423 may comprise the same material as the anode. The first and second conductive films 421 and 423 may also be formed by various other methods.

The first and second conductive films 421 and 423 communicate with multiple contact holes 422 formed in the insulating film 424.

Meanwhile, the cathode 243 is extended to overlap with the electrode power supply line 42. The cathode 243 communicates with the electrode power supply line 42 through the multiple contact holes 425 formed in the passivation film 114.

A conductive film 426 comprising the same material as the anode may be further formed on the lower surface of the cathode 243, as shown in FIG. 10. The conductive film 426 may be formed simultaneously with the anode. The conductive film 426 prevents exposure of the first and second conductive films 421 and 423 during patterning the anode using an etching process, thus preventing corrosion.

Although not shown in the drawings, the cathode 243 may have a separate protective insulating film thereon.

In this way, according to this embodiment of the present invention, the display region may be expanded to the areas of the electrode power supply line 42 connected to the cathode 243 and the driving power supply line 41. Therefore, a more light emission-efficient organic electroluminescent display may be realized.

In addition, the electrode power supply line 42 may be formed at least as wide as the width of the sealing member 13 coated with the sealing material 131, as shown in FIG. 9. Due to such a sufficiently large electrode power supply line 42, a line resistance may be reduced, and thus, a voltage drop may be prevented. Furthermore, due to such multi-layered power lines, the line resistance of the electrode power supply line 42 may be greatly reduced. As an example of the multi-layered electrode power supply line 42, a first conductive film comprising the same material as the gate electrode, a second conductive film comprising the same material as the source/drain electrode, and a third conductive film made of the same material as the anode may be formed one onto another in such a way to communicate with each other through contact holes.

It is understood that such an effect of line resistance reduction is equally applied to the driving power supply line 41.

Figure 11:
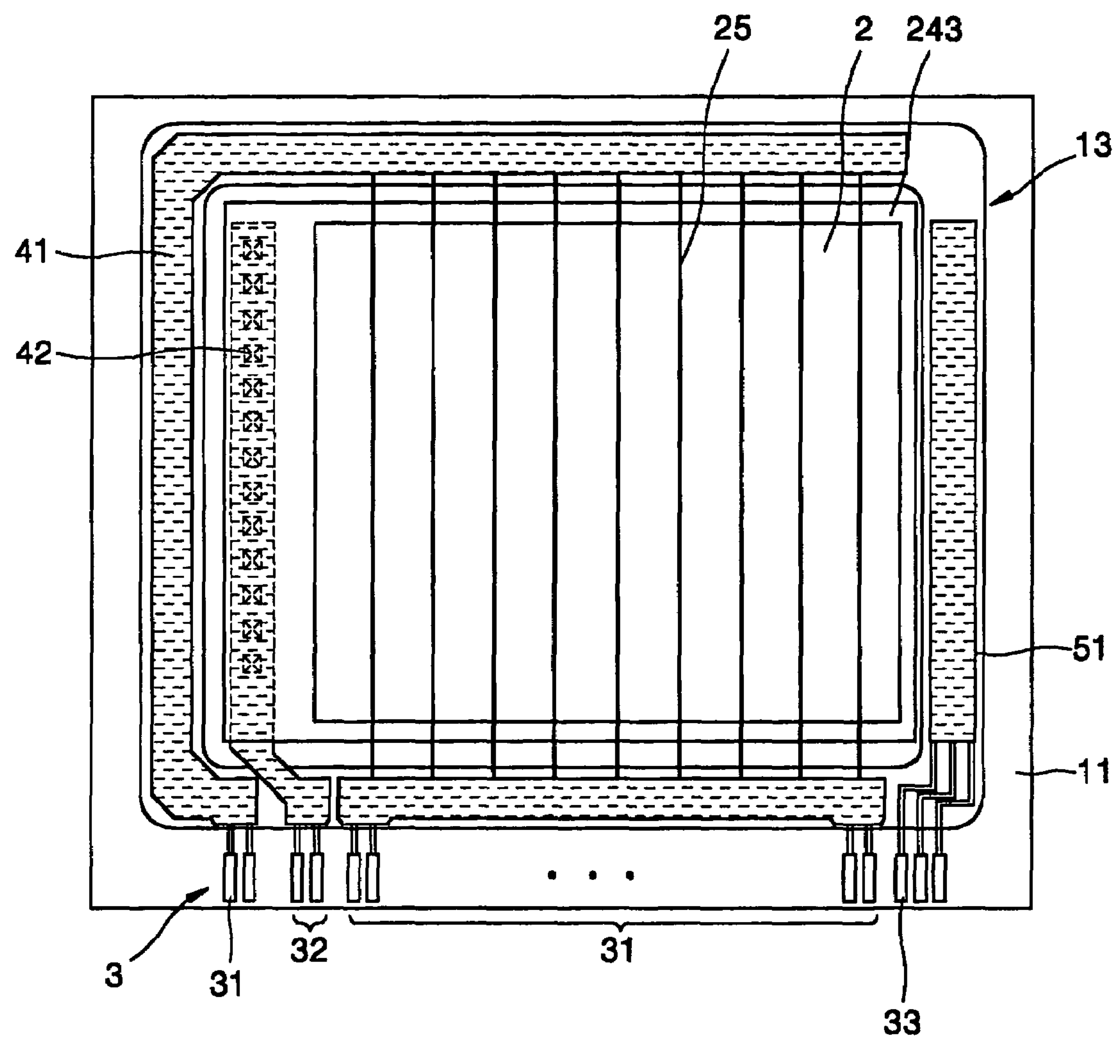
FIG. 11 is a plan view of an active matrix organic electroluminescent display according to another embodiment of the present invention.

FIG. 11 is a plan view of an active matrix organic electroluminescent display according to a third embodiment of the present invention. The fundamental structure of the pixels is the same as in the previously described embodiments of the present invention.

Referring to FIG. 11, in an active matrix organic electroluminescent display of an embodiment of the present invention, the driving power supply line 41 and the vertical circuit 51 are formed between the substrate 11 and the sealing member 13 along the sealing member 13.

In detail, the driving power supply line 41 is arranged along the sealing member 13 and connected to the driving power terminal 31. The vertical circuit 51 is arranged on the substrate 11 at one side of the sealing member 13. The electrode power supply line 42 is connected to the cathode 243 and positioned between the display region 2 and the sealing member 13. A horizontal circuit may be installed on the covering member 12 instead of being installed on the substrate 11, or an external IC or COG may be used as the horizontal circuit, as described above. Since there is no limitation on the installation of the horizontal circuit, the horizontal circuit may also be arranged on the substrate 11 below the sealing member 13.

In this way, according to this embodiment of the present invention, the display region may be expanded to match the areas of the driving power supply line 41 and the vertical circuit 51. Therefore, a more light emission-efficient organic electroluminescent display may be realized. In addition, the line resistance of the driving power supply line 41 may be reduced, and thus, a voltage drop may be prevented.

Figure 12:
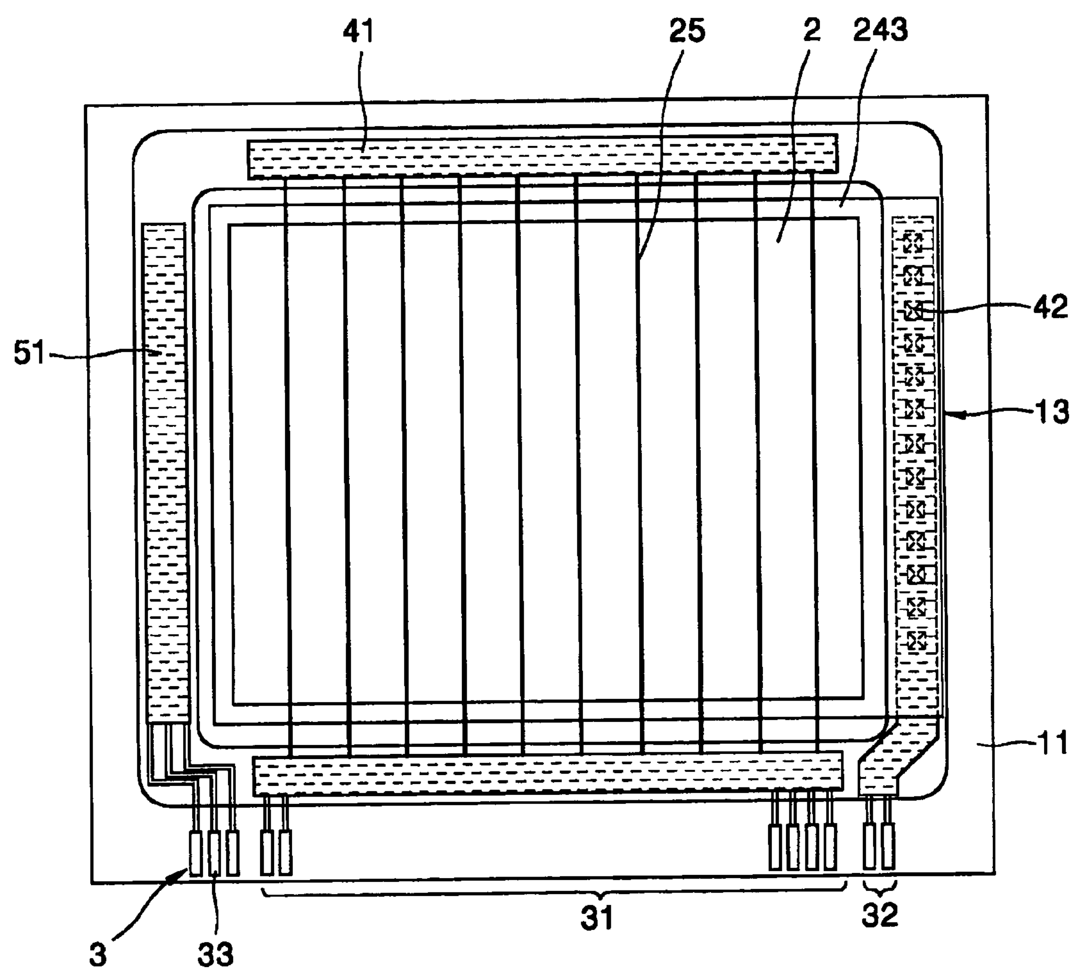
FIG. 12 is a plan view of an active matrix organic electroluminescent display according to another embodiment of the present invention.

FIG. 12 is a plan view of an active matrix organic electroluminescent display according to another embodiment of the present invention, and a fundamental structure such as pixels is the same as in the previous three embodiments of the present invention as described above.

Referring to FIG. 12, in an active matrix organic electroluminescent display of this embodiment of the present invention, the driving power supply line 41, the electrode power supply line 42, and the vertical circuit 51 are formed between the substrate 11 and the sealing member 13 along the sealing member 13.

In detail, the driving power supply line 41 is arranged on the substrate 11 of the upper and lower sides of the display region 2, and the electrode power supply line 42 and the vertical circuit 51 are arranged on the substrate 11 of the left and right sides of the display region 11, respectively, as viewed from FIG. 12. It is understood that the electrode power supply line 42 and the vertical circuit 51 may be installed in opposite positions, unlike in FIG. 12. In this case, a horizontal circuit may be installed on the covering member 12 instead of being installed on the substrate 11, or an external IC or COG may be used as the horizontal circuit, as described above.

In this way, according to this embodiment of the present invention, all of the driving power supply line 41, the electrode power supply line 42, and the vertical circuit 51 are arranged on the substrate 11 below the sealing member 13. Only the display region 2 is present inside the sealing member 13. As a result, the display region may be expanded as much as the areas of the driving power supply line 41, the electrode power supply line 42, and the vertical circuit 51. Therefore, a more light emission-efficient display may be realized. In addition, the resistance of the driving power supply line 41 and the electrode power supply line 42 may be reduced, and thus, a voltage drop may be prevented.

The horizontal circuit may also be installed on the substrate 11 below the sealing member 13. Further, other types of lines and circuits may be installed along the sealing member 13 to increase the size of the display region 2.

The above descriptions may be applied to various flat panel displays such as an inorganic electroluminescent display and a liquid crystal display, in addition to an organic electroluminescent display.

As is apparent from the above descriptions, the present invention has at least the following advantages.

First, power supply lines and circuits are installed on a substrate below a sealing member. Therefore, the ratio of a display region to the total size of a display is increased, thus reducing a non-emission region.

Second, power supply lines are formed with multi-layered conductive films that are connected to each other, thus reducing a line resistance.

Third, power supply lines and circuits are installed on a substrate below a sealing member/sealing material. Therefore, the power supply lines and the circuits may be formed at least as wide as the width of the sealing member/material.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display comprising:

a display region formed on a substrate, the display region comprising a plurality of sub-pixels, each sub-pixel including at least one thin film transistor having a gate electrode, a source electrode and a drain electrode and a self-emission device including a first electrode and a second electrode, and displaying a predetermined image;

a covering member to cover at least the display region;

a sealing member comprising a sealing material coated outside and around at least the display region, by which edges of the covering member are bonded to the substrate to seal at least the display region;

a terminal region installed on the substrate outside the sealing member;

a plurality of VDD lines traversing the display region, each VDD line being connected to at least one of the thin film transistors; and a driving power supply line to supply a driving potential power and/or a source current to the plurality of VDD lines, the driving power supply line comprising at least two conductive layers and being arranged so that at least a part of each of the at least two conductive layers of the driving power supply line is positioned between the sealing member and the substrate.

2. The flat panel display according to claim 1, further comprising an insulating film interposed between the conductive layers of the driving power supply line, wherein the conductive layers of the driving power supply line communicate with each other.

3. The flat panel display according to claim 2, wherein the conductive layers of the driving power supply line communicate with each other through at least one contact hole formed in the insulating film.

4. The flat panel display according to claim 1, wherein one of the conductive layers of the driving power supply line comprises a same material as a material of the gate electrodes of the display region.

5. The flat panel display according to claim 1, wherein one of the conductive layers of the driving power supply line comprises a same material as a material of at least one of the source electrodes and the drain electrodes of the display region.

6. The flat panel display according to claim 1, wherein one of the conductive layers of the driving power supply line comprises a same material as a material of the first electrode or the second electrode of the self-emission device of the display region.

7. The flat panel display according to claim 1, wherein the driving power supply line is connected to a driving power terminal positioned at the terminal region and is arranged along the sealing member.

8. The flat panel display according to claim 1, further comprising at least one circuit to control the self-emission device of the display region, wherein at least a part of the at least one circuit is arranged between the sealing member and the substrate.

9. The flat panel display according to claim 1, wherein the first electrode is a common electrode shared by the plurality of sub-pixels and wherein the flat panel display further comprises an electrode power supply line to supply an electric power to the first electrode and wherein at least a part of the electrode power supply line is arranged between the sealing member and the substrate.

10. The flat panel display according to claim 9, wherein the electrode power supply line comprises at least two conductive layers.

11. The flat panel display according to claim 10, further comprising an insulating film interposed between the conductive layers of the electrode power supply line, wherein the conductive layers of the electrode power supply line communicate with each other.

12. The flat panel display according to claim 11, wherein the conductive layers of the electrode power supply line communicate with each other through at least one contact hole formed in the insulating film.

13. The flat panel display according to claim 10, wherein one of the conductive layers of the electrode power supply line comprises a same material as a material of the gate electrodes of the display region.

14. The flat panel display according to claim 10, wherein one of the conductive layers of the electrode power supply line comprises a same material as a material of at least one of the source electrodes and the drain electrodes of the display region.

15. The flat panel display according to claim 10, wherein one of the conductive layers of the electrode power supply line comprises a same material as a material of the second electrode of the self-emission device of the display region.

16. The flat panel display according to claim 9, wherein the first electrode extends to cover at least a part of the electrode power supply line arranged between the sealing member and the substrate.

17. The flat panel display according to claim 16, further comprising an insulating film interposed between first electrode and the electrode power supply line arranged between the sealing member and the substrate, wherein the first electrode and the electrode power supply line communicate with each other through at least one contact hole formed in the insulating film.

18. The flat panel display according to claim 1, wherein the self-emission device is an organic electroluminescent device.

19. The flat panel display according to claim 1, wherein the covering member is a metal cap or an insulating substrate.

20. A flat panel display comprising:

a display region formed on a substrate, the display region comprising a plurality of sub- pixels, each sub-pixel including at least one thin film transistor having a gate electrode, a source electrode and a drain electrode, and a self-emission device with a first electrode and second electrode, wherein the first electrode is a common electrode shared by the plurality of sub-pixels, and displaying a predetermined image;

a covering member to cover at least the display region;

a sealing member made of a sealing material coated outside and around at least the display region, by which edges of the covering member are bonded to the substrate to seal at least the display region;

a terminal region installed on the substrate outside the sealing member;

an electrode power supply line to supply an electric power to the first electrode, the electrode power supply line comprising at least two conductive layers and being arranged so that at least a part of each of the at least two conductive layers of the electrode power supply line is positioned between the sealing member and the substrate;

an insulating film interposed between the conductive layers of the electrode power supply line, wherein the conductive layers of the electrode power supply line communicate with each other, and wherein the first electrode extends to cover at least a part of the electrode power supply line arranged between the sealing member and the substrate.

21. The flat panel display according to claim 20, wherein the conductive layers of the electrode power supply line communicate with each other through at least one contact hole formed in the insulating film.

22. The flat panel display according to claim 20, wherein one of the conductive layers of the electrode power supply line comprises a same material as a material of the gate electrodes of the display region.

23. The flat panel display according to claim 20, wherein one of the conductive layers of the electrode power supply line comprises a same material as a material of at least one of the source electrodes and the drain electrodes of the display region.

24. The flat panel display according to claim 20, wherein one of the conductive layers of the electrode power supply line comprises a same material as a material of the second electrodes of the self-emission device of the display region.

25. The flat panel display according to claim 20, wherein the electrode power supply line is connected to an electrode power terminal positioned at the terminal region and is arranged along the sealing member.

26. The flat panel display according to claim 20, further comprising an insulating film interposed between the first electrode and the electrode power supply line arranged between the sealing member and the substrate, wherein the first electrode and the electrode power supply line communicate with each other through at least one contact hole formed in the insulating film.

27. The flat panel display according to claim 20, further comprising at least one circuit to control the self-emission device of the display region, wherein at least a part of the at least one circuit is arranged between the sealing member and the substrate.

28. The flat panel display according to claim 20, wherein the self- emission device is an organic electroluminescent device.

29. The flat panel display according to claim 20, wherein the covering member is a metal cap or an insulating substrate.

30. A flat panel display comprising:

a display region formed on a substrate to display a predetermined image, the display region comprising a plurality of sub-pixels, each sub-pixel including at least one thin film transistor comprising a gate electrode, a source electrode, a drain electrode and a self-emission device with a first electrode and a second electrode;

a covering member to cover at least the display region, wherein a sealing material at least bonds edges of the covering member to the substrate;

a terminal region installed on the substrate outside the display region; and a driving power supply line to supply a driving potential power and/or a source current to the thin film transistors of the display region, the driving power supply line comprising at least two conductive layers and being arranged so that at least a part of each of the at least two conductive layers of the driving power supply line is positioned between the sealing material and the substrate and wherein a width of the driving power supply line is equal to a width of the sealing member, wherein the first electrode is a common electrode shared by the plurality of sub-pixels, wherein the flat panel display further comprises an electrode power supply line to supply an electric power to the first electrode of the self-emission device of the display region, wherein at least a part of the electrode power supply line is arranged between the sealing material and the substrate, and wherein the first electrode extends to cover at least a part of the electrode power supply line arranged between the sealing material and the substrate.

31. The flat panel display according to claim 30, further comprising an insulating film interposed between the conductive layers of the driving power supply line, wherein the conductive layers of the driving power supply line communicate with each other.

32. The flat panel display according to claim 31, wherein the conductive layers of the driving power supply line communicate with each other through at least one contact hole formed in the insulating film.

33. The flat panel display according to claim 30, wherein one of the conductive layers of the driving power supply line comprises a same material as a material of the gate electrode of the display region.

34. The flat panel display according to claim 30, wherein one of the conductive layers of the driving power supply line comprises a same material as a material of at least one of the source electrodes and the drain electrodes of the display region.

35. The flat panel display according to claim 30, wherein one of the conductive layers of the driving power supply line comprises a same material as a material of the first electrode or the second electrode of the self-emission device of the display region.

36. The flat panel display according to claim 30, wherein the driving power supply line is connected to a driving power terminal positioned at the terminal region and is arranged along the sealing material.

37. The flat panel display according to claim 30, further comprising at least one circuit to control the self-emission device of the display region, wherein at least a part of the at least one circuit is arranged between the sealing material and the substrate.

38. The flat panel display according to claim 30, wherein the electrode power supply line comprises at least two conductive layers.

39. The flat panel display according to claim 38, further comprising an insulating film interposed between the conductive layers of the electrode power supply line, wherein the conductive layers of the electrode power supply line communicate with each other.

40. The flat panel display according to claim 39, wherein the conductive layers of the electrode power supply line communicate with each other through at least one contact hole formed in the insulating film.

41. The flat panel display according to claim 38, wherein one of the conductive layers of the electrode power supply line comprises a same material as a material of the gate electrodes of the display region.

42. The flat panel display according to claim 38, wherein one of the conductive layers of the electrode power supply line comprises a same material as a material of at least one of the source electrodes and the drain electrodes of the display region.

43. The flat panel display according to claim 38, wherein one of the conductive layers of the electrode power supply line comprises a same material as a material of the second electrode of the self-emission device of the display region.

44. The flat panel display according to claim 30, further comprising an insulating film interposed between the first electrode and the electrode power supply line arranged between the sealing material and the substrate, wherein the first electrode and the electrode power supply line communicate with each other through at least one contact hole formed in the insulating film.

45. The flat panel display according to claim 30, wherein the self-emission device is an organic electroluminescent device.

46. The flat panel display according to claim 30, wherein the covering member is a metal cap or an insulating substrate.

47. A flat panel display comprising:

a display region formed on a substrate, having a plurality of self-emission devices, each self-emission device having a first electrode and a second electrode wherein the first electrode is a common electrode shared by the plurality of self-emission devices, wherein the display region displays a predetermined image;

a covering member to cover at least the display region, wherein a sealing material at least bonds edges of the covering member to the substrate; and an electrode power supply line to supply an electric power to the first electrode, the electrode power supply line comprising at least two conductive layers and being arranged so that at least a part of each of the at least two conductive layers of the electrode power supply line is positioned between the sealing material and the substrate, wherein a width of the electrode power supply line is equal to a width of the sealing member and wherein the first electrode extends to cover at least a part of the electrode power supply line arranged between the sealing material and the substrate.

48. The flat panel display of claim 47, wherein:

the display region further includes a plurality of thin film transistors, each comprising a gate electrode, a source electrode, and a drain electrode; and a terminal region installed on the substrate outside the sealing material.

49. The flat panel display according to claim 48, wherein one of the conductive layers of the electrode power supply line comprises a same material as a material of the gate electrodes of the display region.

50. The flat panel display according to claim 48, wherein one of the conductive layers comprises a same material as a material of at least one of the source electrodes and the drain electrodes of the display region.

51. The flat panel display according to claim 48, wherein the electrode power supply line is connected to an electrode power terminal positioned at the terminal region and is arranged along the sealing material.

52. The flat panel display according to claim 47, further comprising an insulating film interposed between the conductive layers of the electrode power supply line, wherein the conductive layers of the electrode power supply line communicate with each other.

53. The flat panel display according to claim 52, wherein the conductive layers of the electrode power supply line communicate with each other through at least one contact hole formed in the insulating film.

54. The flat panel display according to claim 47, wherein one of the conductive layers of the electrode power supply line comprises a same material as a material of the second electrode of the self-emission devices of the display region.

55. The flat panel display according to claim 47, further comprising an insulating film interposed between the first electrode and the electrode power supply line arranged between the sealing material and the substrate, wherein the first electrode and the electrode power supply line communicate with each other through at least one contact hole formed in the insulating film.

56. The flat panel display according to claim 47, further comprising at least one circuit to control the self-emission device of the display region, wherein at least a part of the at least one circuit is arranged between the sealing material and the substrate.

57. The flat panel display according to claim 47, wherein the self-emission devices are an organic electroluminescent devices.

58. The flat panel display according to claim 47, wherein the covering member is a metal cap or an insulating substrate.

59. A flat panel display comprising:

a display region formed on a substrate, wherein the display region includes a self- emission device with two electrodes a covering member to cover at least the display region, wherein a sealing material at least bonds edges of the covering member to the substrate;

a driving power supply line having at least two conductive layers arranged so that at least a part of each of the at least two conductive layers of the driving power supply line is positioned between the sealing material and the substrate, and an electrode power supply line having at least two conductive layers arranged so that at least a part of each of the at least two conductive layers of the electrode power supply line is positioned between the sealing material and the substrate, wherein the display region extends to an area of the driving power supply line and the electrode power supply line.

60. The flat panel display according to claim 59, wherein:

the display region comprises a gate electrode, a source electrode, and a drain electrode and displays a predetermined image; and a terminal region installed on the substrate outside the display region, wherein the electrode power supply line supplies an electric power to at least one of the two electrodes of the self-emission device.

* * * * *